United States Patent [19]

Kodai et al.

[11] Patent Number: 5,173,840

[45] Date of Patent: Dec. 22, 1992

[54] MOLDED IC CARD

[75] Inventors: Shojiro Kodai; Katsunori Ochi; Osamu Murakami, both of Hyogo, all of Japan

[73] Assignee: Mitsubishi Denki Kabushiki Kaisha, Tokyo, Japan

[21] Appl. No.: 691,304

[22] Filed: Apr. 25, 1991

[30] Foreign Application Priority Data

May 7, 1990 [JP] Japan .................... 2-117984

[51] Int. Cl.$^5$ .............................. H05K 1/14
[52] U.S. Cl. ..................... 361/395; 361/392; 361/401; 361/399; 364/708; 235/488; 235/492; 257/687
[58] Field of Search ............... 361/380, 392, 394, 395, 361/397, 399, 402, 424, 401; 174/52.2; 357/72, 80; 364/708, 900; 235/492, 488, 487, 489

[56] References Cited

U.S. PATENT DOCUMENTS

| 4,682,017 | 7/1987 | Nakahara et al. ........... 235/492 |
| 4,746,392 | 5/1988 | Hoppe ........................... 156/244.12 |
| 4,754,319 | 6/1988 | Saito et al. ................... 357/72 |
| 4,758,689 | 7/1988 | Nakao et al. . |
| 4,961,893 | 9/1990 | Rose . |
| 5,030,407 | 7/1991 | Mollet et al. . |

FOREIGN PATENT DOCUMENTS

| 0340100 | 11/1989 | European Pat. Off. . |
| 2586886 | 3/1987 | France . |
| 60-189587 | 9/1985 | Japan . |
| 60-217492 | 10/1985 | Japan . |

Primary Examiner—Leo P. Picard
Assistant Examiner—Young S. Whang
Attorney, Agent, or Firm—Lowe, Price, LeBlanc & Becker

[57] ABSTRACT

An IC card includes a thin plate forming an external surface of the card, a circuit board formed on an internal surface of the thin plate, and a frame surrounding peripheries of the thin plate and the circuit board. A space defined by the frame and the surface plate is filled with molded resin. A portion of an inner peripheral surface of the frame projects into the resin. The molded resin completely covers a surface of the circuit board and integrates the frame and the thin plate.

9 Claims, 6 Drawing Sheets

FIG. 2A
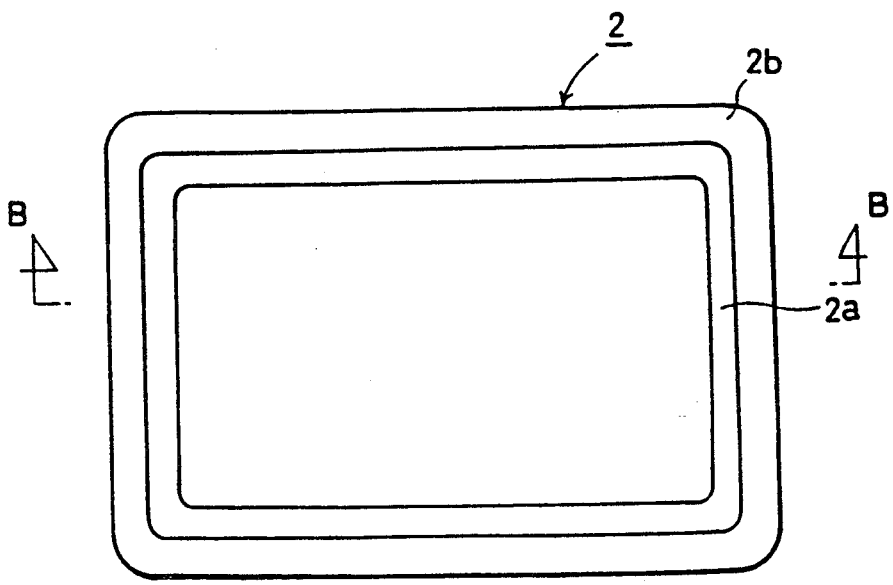
FIG. 2B
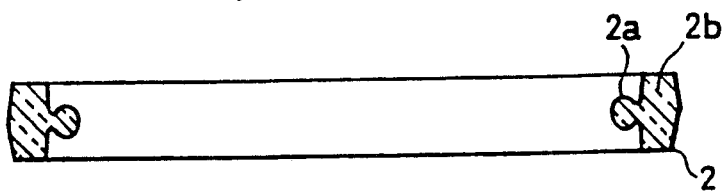
FIG. 2C    FIG. 2D
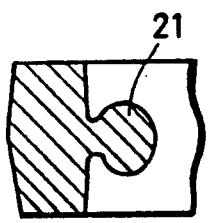 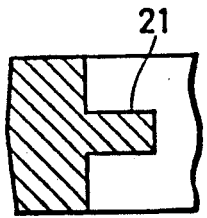

MOLDED IC CARD

BACKGROUND OF THE INVENTION

1. Field of the Invention

The present invention relates to structures of an IC card in which a microcomputer and/or an IC memory are embedded in a plate such as a credit-card-sized plate.

2. Description of the Background Art

FIGS. 9A and 9B show a conventional IC card. FIG. 9A is a plan view of the IC card of a non-contact type, and FIG. 9B is a structural cross section taken along line C—C in FIG. 9B.

The IC card has the same size as that of credit cards, and incorporates an integrated circuit(s) such as a microprocessor and/or a memory. The IC card has advantages that a memory capacity is larger than those of a magnetic card or the like, and that information can be altered.

Referring to FIGS. 9A and 9B, an IC card 1 includes a pair of upper and lower casings 101 and 102, and a circuit board 4 assembled in the casings 101 and 102. On a surface of the circuit board 4, there are formed an IC (integrated circuit) device 5 as well as an interconnection pattern 9 connected to the IC device 5. The circuit board 4 is fixed to an internal surface of the lower casing 102. A space is formed between the circuit board 4 and an internal surface of the upper casing 101, and between the board and the internal surface of the lower casing 102.

FIGS. 10A and 10B illustrates a conventional IC card of another type. FIG. 10A is a structural plan view of the IC card of a contact type having an electrode terminal for an external connection, and FIG. 10B is a structural cross section taken along line D—D in FIG. 10A. The IC card of this type includes an electrode terminal 41 formed on a portion of the surface of the lower casing 102. The electrode terminal 41 is electrically connected to the interconnection pattern 9 on the circuit board 4 via a through hole 42.

The IC cards 1 of the non-contact and contact types described above have spaces 11 in casings 10 made from plastics. The space 11 must have the size large enough to prevent contact between the upper casing 101 and the IC device 5 when the card 1 is deformed to a large extent by an external force. Due to this large space 11, the IC card 1 cannot be made thin.

A strength of, particularly, the upper casing 101 depends only on the thickness of the upper casing 101. Therefore, in order to increase the strength of the IC card 1, the upper casing 101 and the lower casing 102 must have large thicknesses, respectively. This further impedes the reduction of thickness of the IC card.

Further, in the prior art IC card, moisture may enter through a gap between the upper and lower casings 101 and 102. Therefore, the prior art IC card has a problem of low environmental resistivity.

Meanwhile, IC cards having resin coating on the integrated circuit boards provided with the IC devices have been known.

U.S. Pat. No. 4,746,392 has disclosed an IC card in which an integrated circuit module is fitted into a portion of a stack of films which forms a card body. This card body is formed of a stacked structure of films without a frame member surrounding peripheries of these films. The card body has a concave portion. An IC module is fitted into this concave portion, and the gap between the IC module and the concave portion is filled with resin. This resin member covers only the periphery of the IC module, and does not serve as a structural member for the card body.

This IC card further employs a film covering a surface of the resin. Therefore, employment of this surface film impedes the reduction of thickness of the IC card. Further, since the card body is formed of the stacked structure of thin films, the card has low strength at its end or edge portions.

SUMMARY OF THE INVENTION

It is an object of the invention to reduce a thickness of an IC card.

It is another object of the invention to improve strength of an IC card.

It is still another object of the invention to provide an IC card having structures which enables easy manufacturing of an IC card.

An IC card according to the invention comprises a surface plate forming one surface of the IC card, and a circuit board attached to an internal surface of this surface plate and incorporating a semiconductor element. Further, the IC card comprises a frame which extends along a whole peripheral edge of the surface plate and surrounds the surface plate and the circuit board. A space defined by the frame and the surface plate is filled with a filler of which surface forms a rear surface of the IC card. A portion of an inner peripheral surface of the frame projects into the filler.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a structural plan view of a frame 2 shown in FIG. 1A;

FIG. 2B is a structural cross section taken along line B—B in FIG. 2A;

FIG. 2C is a fragmentary cross section of a frame 2;

FIG. 2D is a fragmentary cross section of a frame, similar to FIG. 2C;

DESCRIPTION OF THE PREFERRED EMBODIMENTS

Figure 1A:
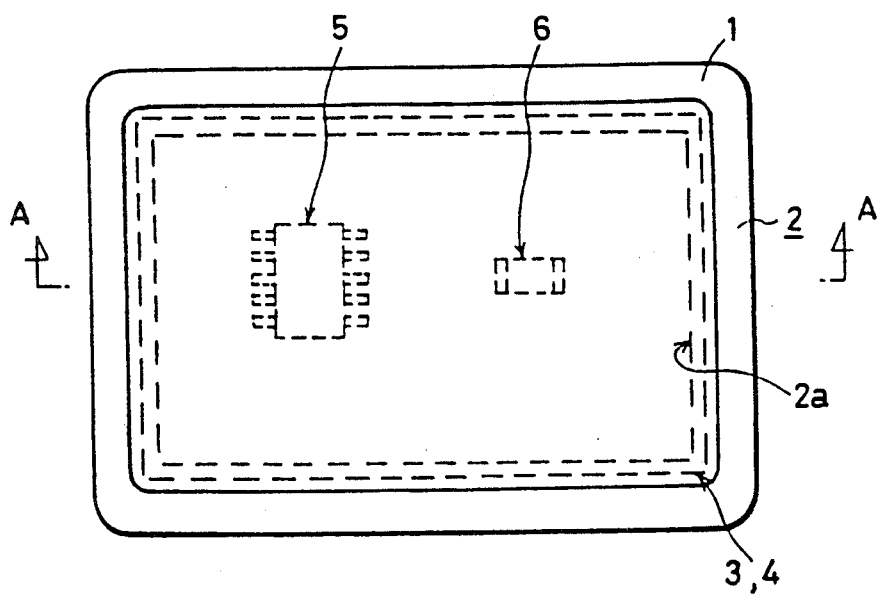
FIG. 1A is a structural plan view of an IC card of an embodiment of the invention.
Figure 1B:
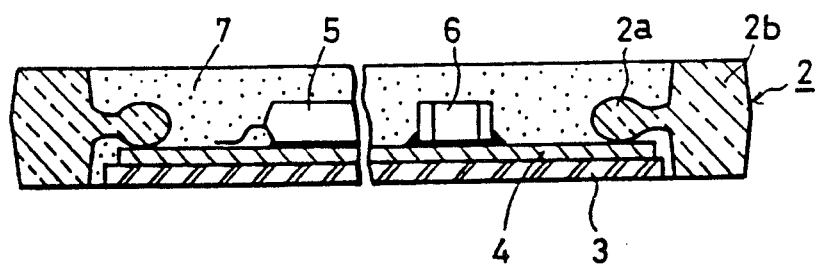
FIG. 1B is a structural cross section taken along line A—A in FIG. 1A.

An IC card of a first embodiment of the invention is illustrated in FIGS. 1A and 1B. The IC card 1 includes a thin plate 3 made of resin, a circuit board 4 fixed to a surface of the thin plate 3, a frame 2 surrounding whole peripheries of the thin plate 3 and the circuit board 4, and a molded resin 7 filled inside the frame 2. Other surface of the thin plate 3 forms a top surface of the IC card 1. A surface of the molded resin 7 forms a rear or bottom surface of the IC card 1. Further, the frame 2 principally forms side surfaces of the IC card I.

The thin plate 3 is formed of a thin premolded plate of resin. The circuit board 4 is fixed to an internal surface of the thin plate 3. A predetermined circuit pattern is formed on a surface of a circuit board 4. The surface of the circuit board 4 also bears an IC device 5 and a chip part 6 which have functions such as a memory function and an operation function.

Now, structures of the frame 2 will be described with reference to FIGS. 2A-2D. The frame 2 has a rim-like body 2b and a rib or inward projection 2a projected from an inner peripheral surface of the frame body 2b. The rib 2a is located at a substantially central position of the body 2b of the frame 2 with respect to a direction of the card thickness. The rib 2a is in contact with the surface of the circuit board 4 in a finished card. The rib 2a is continuously formed along the inner periphery of the frame body 2b, and has a section which is preferably of a dumbbell-shape, as shown in FIG. 2C, or of a square shape, as shown in FIG. 2D. Of course, other sectional shapes may be employed.

Returning to FIG. 1B, the molded resin 7 completely fills a space formed between the frame 2, thin plate 3 and circuit board 4. This molded resin 7 has a protection function for protecting circuits formed on the circuit board 4 and a function as a strength member in the IC card. That is, the complete covering of the surface of, the circuit board 4 with the molded resin 7 improves an environmental resistivity such as a water proof. Further, the rigidity of the molded resign 7 itself resists an external force applied to the IC card 1 to restrict the application of the external force onto the circuit board 4. It is preferable to form all of the frame 2, thin plate 3 and molded resin 7 from the same material such as liquid crystal polymer. However, these may be formed of different kinds of resin.

Now, manufacturing method of the IC card shown in FIG. 1B will be described with reference to FIGS. 3A-3D.

Figure 3A:
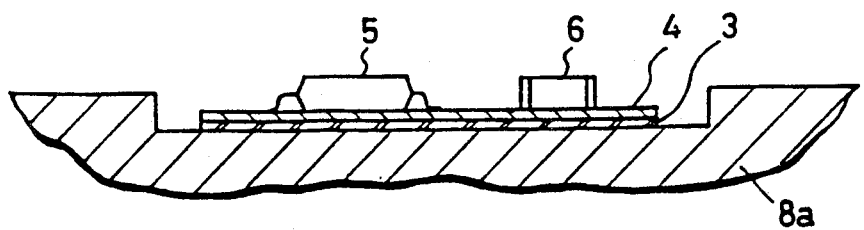
FIGS. 3A-3D are cross sections illustrating manufacturing steps of an IC card shown in FIG. 1B.

First, as shown in FIG. 3A, the thin plate 3 is laid on a lower die 8a of a metal mold 8. Further, the circuit board 4 is laid on the surface of the thin plate 3. The circuit board 4 has the predetermined circuit pattern, IC device 5 and chip parts 6 which are formed in advance on the surface thereof.

Figure 3B:
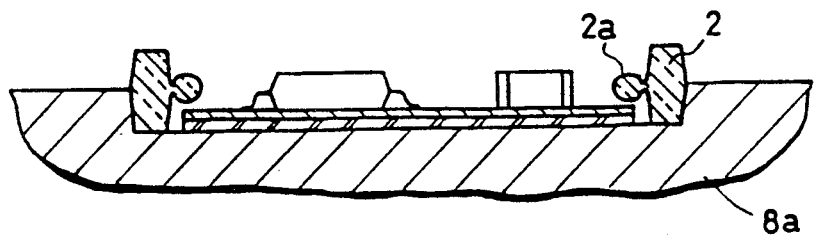

Then, as shown in FIG. 3B, the frame 2 is fitted into a concave in the lower die 8a.

Figure 3C:
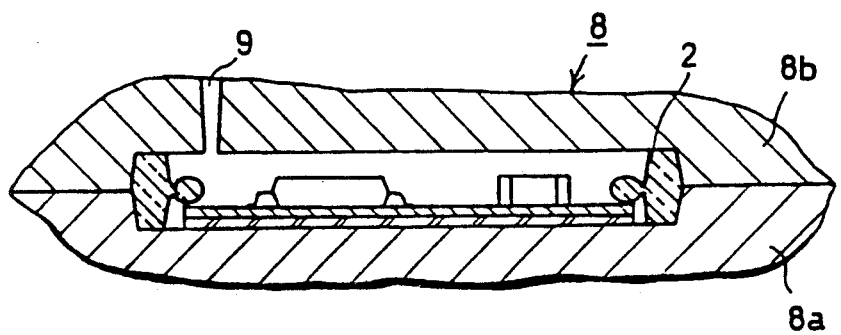

Then, as shown in FIG. 3C, the upper die 8b is lowered to close the mold 8. In this condition, the external surface of the frame 2 is in tight contact an internal surface of the mold 8.

Figure 3D:
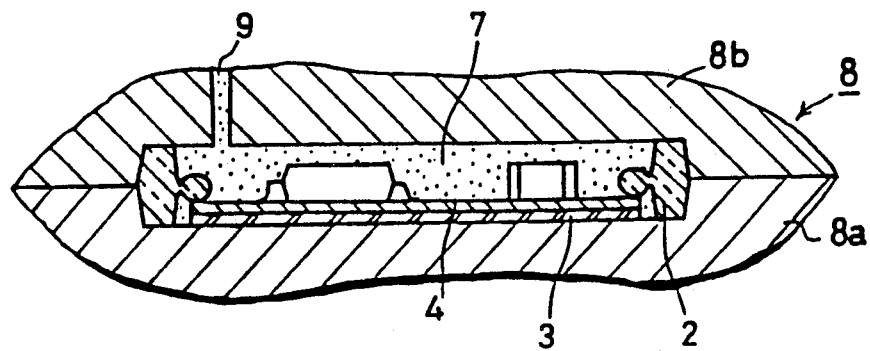

Then, as shown in FIG. 3D, liquid resin is introduced into the mold 8 through a gate 9 formed in the upper die 8b. The resin is supplied to fill completely the space inside the mold 8. Thereafter, the resin is hardened, and thus the frame 2, thin plate 3, circuit board 4 and molded resin 7 are integrated. The mold 8 is opened to release the IC card 1.

As described above, the IC card 1 is manufactured by the integration of the respective components, i.e., the frame 2, thin plate 3 and circuit board 4 by the molded resin 7. Therefore, neither bonding step nor stacking step is required, which simplifies the manufacturing steps. Further, the rib 2a provided in the frame 2 reliably prevents separation of the molded resin 7 and the frame 2 from each other.

Figure 4:
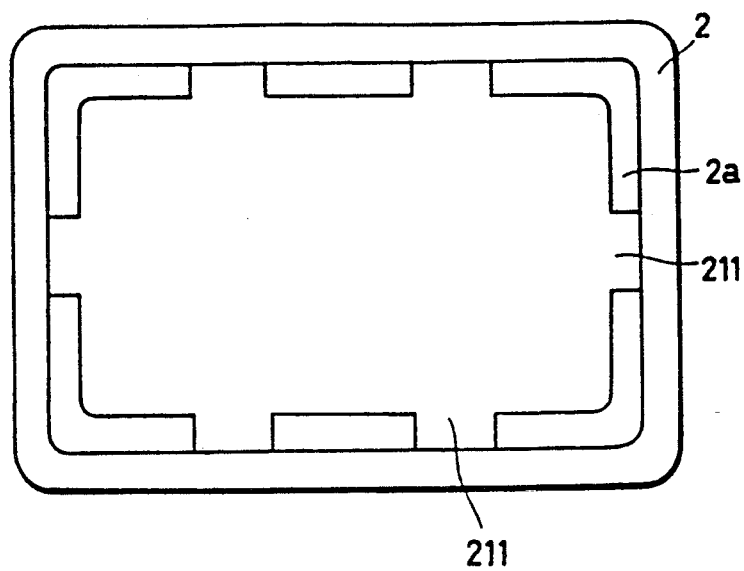
FIG. 4 is a top view of a frame 2 used in an IC card of a second embodiment of the invention.
Figure 5:
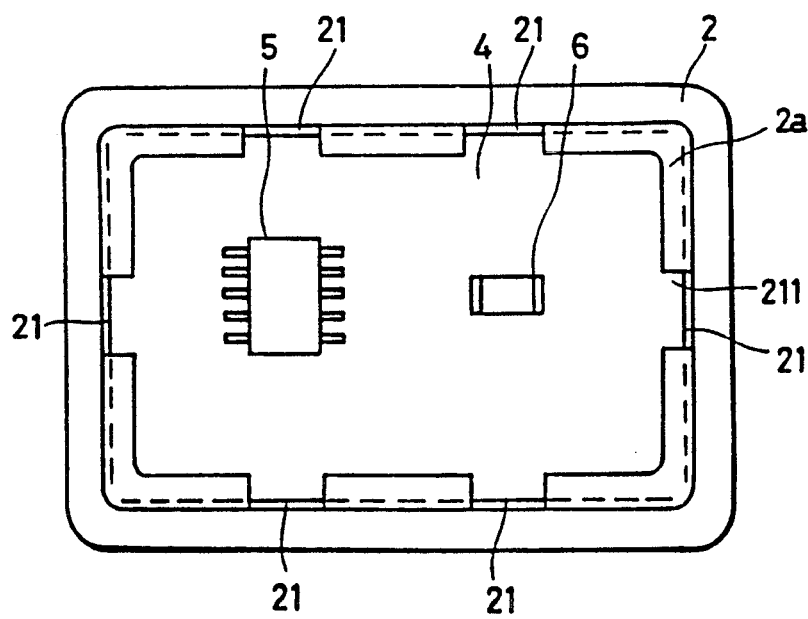
FIG. 5 is a structural top view of an IC card using a frame 2 shown in FIG. 4.

Then, a second embodiment of the invention will be described below. Referring to FIG. 4, the frame 2 of the IC card of the second embodiment is provided at its inner peripheral surface with the rib 2a which has a plurality of recesses 211. FIG. 5 illustrates the frame 2 and the circuit board 4 assembled therein. The recesses 211 provided in the rib 2a form gaps 21 between the frame 2 and the circuit board 4. The gaps 21 serve such that a space between the frame 2 and the thin plate 3 is sufficiently filled with the introduced resin through these gaps 21.

Figure 6:
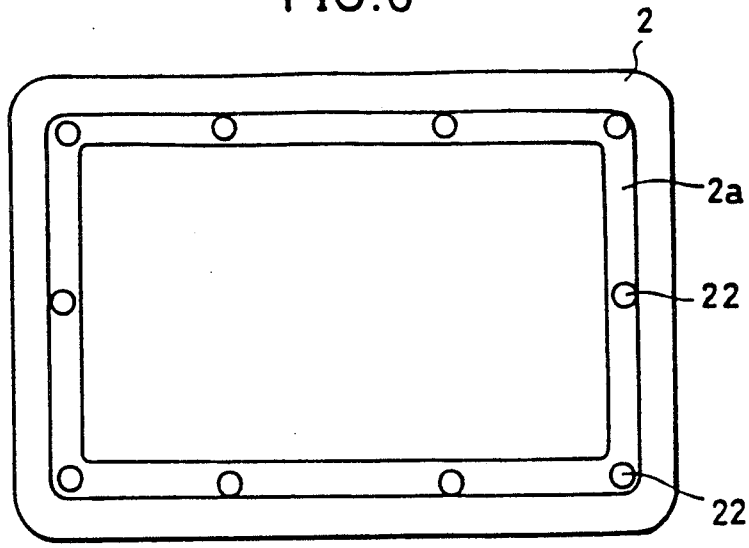
FIG. 6 is a top view of a frame 2 used in an IC card of a third embodiment of the invention.
Figure 7:
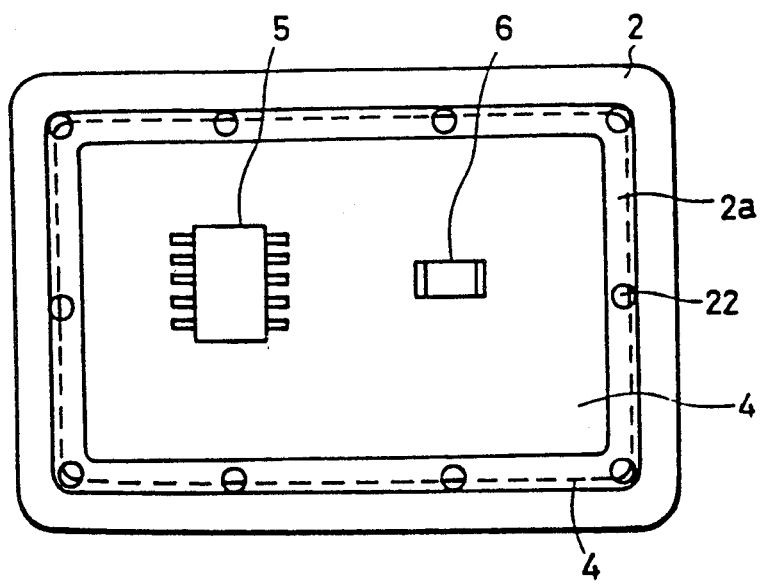
FIG. 7 is a structural plan view of an IC card using a frame 2 shown in FIG. 6.

Further, a third embodiment of the invention will be described below. As shown in FIG. 6, the frame 2 of the third embodiment is provided at several portions of the rib 2a with through holes 22. FIG. 7 shows the frame 2 and the circuit board 4 assembled therein. The through holes 22 in the rib 2a are located substantially at a boundary region between the frame 2 and the circuit board 4. These through holes 22 serve to fill completely the space with the resin, similarly to the recesses 211 shown in FIG. 4.

Figure 8A:
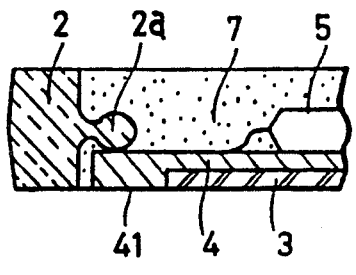
FIG. 8A is a structural fragmentary cross section of an IC card for illustrating a modification of IC cards of first to third embodiments.
Figure 8B:
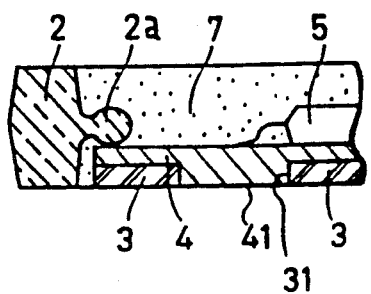
FIG. 8B is a structural fragmentary cross section similar to FIG. 8A for illustrating another modification of an IC card.
Figure 9A:
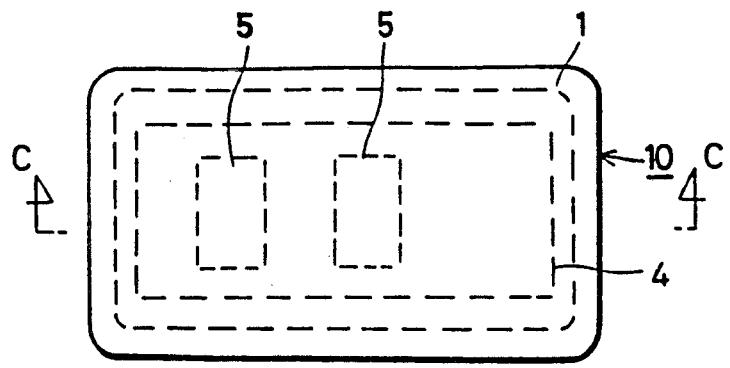
FIG. 9A is a structural plan view of a prior art IC card.
Figure 9B:
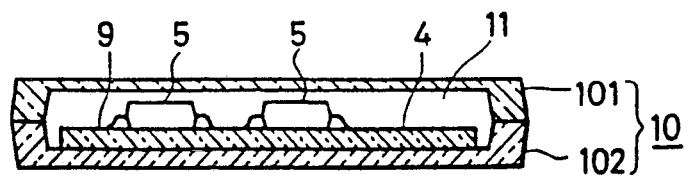
FIG. 9B is a structural cross section taken along line C—C in FIG. 9A.
Figure 10A:
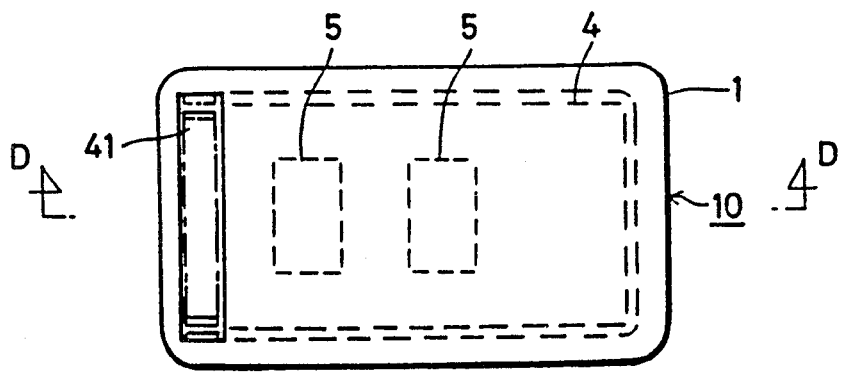
FIG. 10A is a structural plan view of another prior art IC card.
Figure 10B:
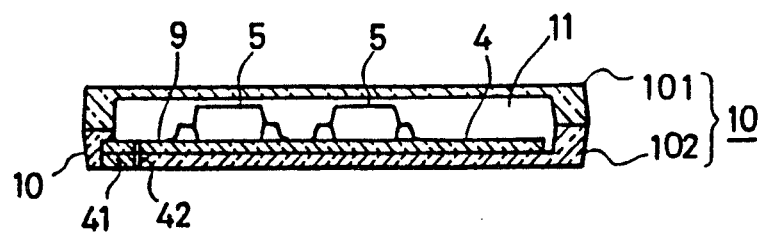
FIG. 10B is a structural cross section taken along line D—D in FIG. 10A.

Then, modifications of the first to third embodiments will be described below. While the above first to third embodiments are described with respect to a so-called non-contact type in which external electrode terminals of the IC cards are not exposed at the external surfaces, these embodiments can be applied to the IC cards of a contact type having exposed external electrode terminals. FIG. 8A illustrates the structures of the IC card, in which the electrode terminal 41 extending from the circuit board 4 is exposed at the surface of the IC card through a space between the frame 2 and the thin plate. FIG. 8B illustrates the IC card having structures in which the thin plate 3 is provided at a predetermined position with an opening 31 through which the external electrode terminal 41 extending from the circuit board 4 is exposed on the card surface.

As described above, the IC card according to the invention is formed of the frame 2, thin plate 3 and circuit board 4 which are integrated by the molded resin 7. The frame 2 improves the strength and shock resistance at the outer peripheral edge of the IC card. The molded resin improves the environmental resistivity such as the water proof for the circuits formed on the circuit substrate. The rib formed at the inner periphery of the frame reliably fixes the frame and the molded resin together. Further, if the same configurations of the frames are employed, production can be performed with the common molds, independent of types of the circuits formed on the circuit board. Therefore, the manufacturing steps can be simplified, resulting in an improved productivity.

Further, the IC card according to the invention is manufactured by filling the space defined by the frame and the thin plate with the molded resin. Therefore, the thicknesses of the IC cards are determined to be constant by the configurations of the metal mold which encloses the frames. Thereby, the IC cards having a small and uniform thickness can be produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An IC card comprising:
   a surface plate forming one surface of said IC card,
   a circuit board attached to an internal surface of said surface plate and incorporating a semiconductor element,
   a frame formed to extend along a peripheral edge of said surface plate and to surround said surface plate and said circuit board, and
   a filler which fills a space defined by said frame and said surface plate and forms a rear surface of said IC card; and
   wherein a portion of an inner peripheral surface of said frame projects into said filler.

2. An IC card according to claim 1, wherein said inward projection is formed continuously along an outer peripheral edge of said circuit substrate.

3. The IC card according to claim 2, wherein said inward projection has a through hole extending from a front side of said IC card to a rear side thereof.

4. The IC card according to claim 1, wherein said inward projection is partially formed along an outer peripheral edge of said circuit board.

5. The IC card according to claim 4, wherein said inward projection has a through hole extending from a front side of said IC card to a rear side thereof.

6. The IC card according to claim 1, wherein said circuit board has a connection terminal penetrating said surface plate and externally exposed.

7. The IC card according to claim 1, wherein said portion of said inner peripheral surface of said frame projecting into said filler is dumbbell-shaped.

8. The IC card comprising:
   a circuit board incorporating a semiconductor element,
   a frame formed to extend along a peripheral edge of said circuit board and to surround said circuit board, and
   a filler which fills a space defined by said frame and forms a surface of said IC card,
   wherein a portion of an inner peripheral surface of said frame projects into said filler to prevent separation of the filler and the frame from each other.

9. The IC card according to claim 8, wherein, said portion of said inner peripheral surface of said frame contacts said circuit board.

* * * * *